United States Patent
Sundstrom

(10) Patent No.: US 7,724,566 B1
(45) Date of Patent: May 25, 2010

(54) MAGNETORESISTIVE RESISTOR MEMORY CELL

(75) Inventor: Lance L. Sundstrom, Pinellas Park, FL (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 76 days.

(21) Appl. No.: 12/230,282

(22) Filed: Aug. 27, 2008

(51) Int. Cl.
*G11C 11/00* (2006.01)

(52) U.S. Cl. .................. 365/158; 365/117; 365/157; 365/97; 365/100

(58) Field of Classification Search ............. 365/158, 365/117, 157, 97, 100
See application file for complete search history.

(56) References Cited

U.S. PATENT DOCUMENTS

| | | | |
|---|---|---|---|
| 6,069,476 A | 5/2000 | Vieux-Rochaz | 324/252 |
| 2005/0088876 A1* | 4/2005 | Fulkerson et al. | 365/173 |
| 2006/0092689 A1* | 5/2006 | Braun et al. | 365/158 |

\* cited by examiner

*Primary Examiner*—Thong Q Le
(74) *Attorney, Agent, or Firm*—John Tarlano

(57) ABSTRACT

A magnetoresistive resistor memory cell having four individually polarizable magnetoresistive resistors that form a magnetoresistive bridge circuit. Each of the four magnetoresistive resistors is surrounded by a write trace segment pair. One upper write trace segment is directly above a magnetoresistive resistor and one lower write trace segment is directly below that resistor. The two write traces of a write trace segment pair are oriented at 90 degrees relative to the anisotropic axis, that is, the length, of the magnetoresistive resistor. The combination of the magnetoresistive resistor bridge circuit and four write trace segment pairs forms a magnetoresistive resistor memory cell.

2 Claims, 6 Drawing Sheets

MAGNETORESISTIVE RESISTOR MEMORY CELL

In the disclosed magnetoresistive resistor memory cell, four individually polarizable magnetoresistive resistors form a magnetoresistive bridge circuit. Each of the four magnetoresistive resistors is surrounded by a write trace segment pair. One upper write trace segment is directly above a magnetoresistive resistor and one lower write trace segment is directly below that resistor. The two write traces of a write trace segment pair are oriented at 90 degrees relative to the anisotropic axis, that is, the length, of the magnetoresistive resistor. The combination of the magnetoresistive resistor bridge circuit and four write trace segment pairs forms a magnetoresistive resistor memory cell.

The eight write trace segments of the four write trace segment pairs are connected into a single series circuit. The series circuit is designed such that the current directions in the upper and lower write trace segments of each write trace segment pair are opposite to one another. This opposition insures that a one turn of current is applied to the magnetoresistive resistor between an upper and lower segment. The series circuit design insures that the write current directions in write trace segment pairs of in-line and parallel magnetoresistive resistor bridge elements are opposite and that the write current directions of write trace segment pairs of diagonally opposite magnetoresistive resistor bridge elements are the same.

A binary bit is stored in the magnetoresistive bridge circuit by means of current passing through the four write trace segment pairs. The value of the binary bit, that is stored in a magnetoresistive bridge circuit, is reliably determinable.

The four magnetoresistive resistors of the magnetoresistive bridge circuit are connected in a bridge circuit. A first leg of the magnetoresistive bridge circuit has a first two magnetoresistive resistors connected in series circuit by means of a first connector line. A second leg of the magnetoresistive bridge circuit has a second two magnetoresistive resistors connected in series circuit by means of a second connector line. Each of the first and second legs of the bridge circuit have first and second ends A first end of each of the first and send legs is connected together by a third connector line. A second end of each of the first and send legs is connected together by a fourth connector line.

A first power line is connected to a first end of the series connected write segment trace pairs. A second power line is connected to a second end of the series connected write segment trace pairs.

Current is sent through the four series connected write segment trace pairs of the magnetoresistive resistor memory cell from the first power line to the second power line. A zero bit is written into the four magnetoresistive resistors by sending a negative current into a first power line and out of the second power line. A one bit is written into the four magnetoresistive resistors by sending a negative current into a second power line and out of the first power line.

With only two power lines, in the disclosed bridge circuit of the memory cell, a single current writes all four magnetoresistive resistors. Therefore there is great uniformity in the writing of binary bits into the four magnetoresistive resistors.

A first tap is taken off of a first leg-line between the first two magnetoresistive resistors of the first leg-line. A second tap is taken off of the second leg-line, between the second two magnetoresistive resistors of the second leg-line. A fifth line is connected between the first tap and a first input of a differential amplifier. A sixth line is connected between the second tap and a second input of the differential amplifier.

A voltage is applied to the third connector line connecting the first end of the first leg and the first end of the second leg of the magnetoresistive bridge circuit. The forth connector line is grounded. A voltage difference between a voltage on the first tap and second tap is detected by the differential amplifier. The sign of the difference is used to determine whether a zero bit or one bit is stored in the magnetoresistive bridge circuit.

Greater reliability in the value of a stored bit is achieved by using the bridge circuit that has four magnetoresistive resistors in two legs of the disclosed magnetoresistive bridge circuit, rather than having only two magnetoresistive resistors in a magnetoresistive circuit.

The voltage difference between the first leg and the second leg of the magnetoresistive bridge circuit is more reliable and consistent than is a voltage difference between two magnetoresistive resistors of a prior art magnetoresistive circuit. This increased voltage difference reliability is due to the fact that the variation in resistance of each of the four magnetoresistive resistors of the disclosed magnetoresistive bridge circuit, tend to cancel each other out. Construction of the four magnetoresistive resistors that is less than optimal is tolerable. Temperature changes, scolding resistance variations and other manufacturing variables are also tolerable with the disclosure memory cell.

A first input of a differential amplifier is connected to the tap on a first leg of the disclosed magnetoresistive bridge circuit. A second input of a differential amplifier is connect to the tap on a second leg of the disclosed magnetoresistive bridge circuit.

By means of the differential amplifier one can determine whether a binary zero or a binary one is stored in the magnetoresistive bridge circuit. The differential amplifier, when connected to the four magnetoresistive resistors, provides a more reliable output signal than does a differential amplifier connected to only two magnetoresistive resistors.

SUMMARY OF THE INVENTION

A magnetoresistive resistor memory cell comprising first and second magnetoresistive resistors connected in series, the first and second magnetoresistive resistors forming a first leg, third and fourth magnetoresistive resistors connected in series, the third and fourth magnetoresistive resistors forming a second leg, a first line for connecting a first end of the first leg to a first end of a second leg, a second line for connecting a second end of the first leg to a second end of the second leg, a first polarization means, the first polarization means within a polarization distance of the first magnetoresistive resistor, a second polarization means, the second polarization means within a polarization distance of the third magnetoresistive resistor, the second polarization means electrically connected to the first polarization means, a third polarization means, the third polarization means within a polarization distance of the second magnetoresistive resistor, the third polarization means electrically connected to the second polarization means, and a fourth polarization means, the fourth polarization means within a polarization distance of the fourth magnetoresistive resistor, the fourth polarization means electrically connected to the third polarization means.

DESCRIPTION OF THE PREFERRED EMBODIMENT

Figure 1:
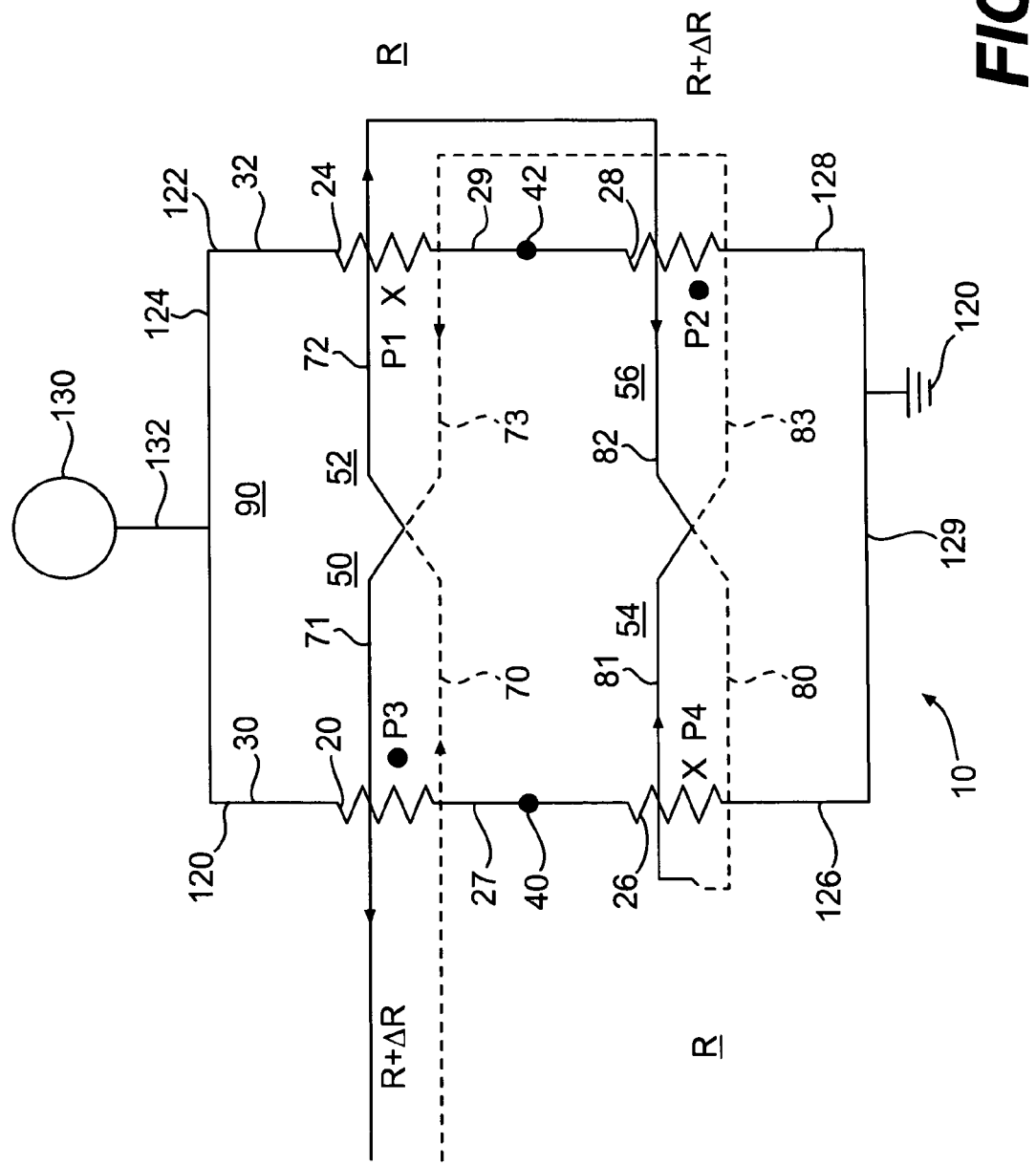
FIG. 1 is a circuit diagram of a magnetoresistive resistor memory cell, the magnetoresistive resistor memory cell having a magnetoresistive bridge circuit and current carrying write trace segments, a one bit being written into the magnetoresistive memory circuit.

FIGS. 1, 3, 5 and 6 show a nonvolatile magnetoresistive resistor bridge circuit 10. The nonvolatile magnetoresistive resistor bridge circuit 10 has four nonvolatile magnetoresistive resistors 20, 24, 26 and 28. Magnetoresistive resistors 20 and 26 are in a first leg 30 of magnetoresistive bridge circuit 10. Magnetoresistive resistors 24 and 28 are in a second leg 32 of bridge circuit 10.

Magnetoresistive resistors 20 and 26 are electrically connected together through a first line 27 and center tap 40. Magnetoresistive resistors 24 and 28 are electrically connected together through a second line 29 and center tap 42.

The magnetoresistive resistors 20 and 24 are driven respectively, that is, nonvolatilely written into, by write trace segment pair 50 and by write trace segment pair 52 in FIG. 1. For the write current direction and write current segment connections shown in FIG. 1, write trace pair 50 applies a outward magnetic field to magnetoresistive resistor 20, and write trace segment pair 52 applies an inward magnetic field to magnetoresistive resistor 24 according to the right hand rule.

The magnetoresistive resistors 26 and 28 are driven respectively, that is nonvolatilely written into, by write trace segment pair 54 and by write trace segment pair 56 in FIG. 1. For the write current direction and write current segment connections shown in FIG. 1, write trace pair 54 applies an inward magnetic field to magnetoresistive resistor 26, and write trace segment pair 56 applies an outward magnetic field to magnetoresistive resistor 28 according to the right hand rule.

In FIGS. 1, 3, 5 and 6 the magnetoresistve resistors 20, 24, 26 and 28, in combination with the four write trace segment pairs 50, 52, 54 and 56 form a magnetoresistive resistor memory cell 90.

Figure 2:
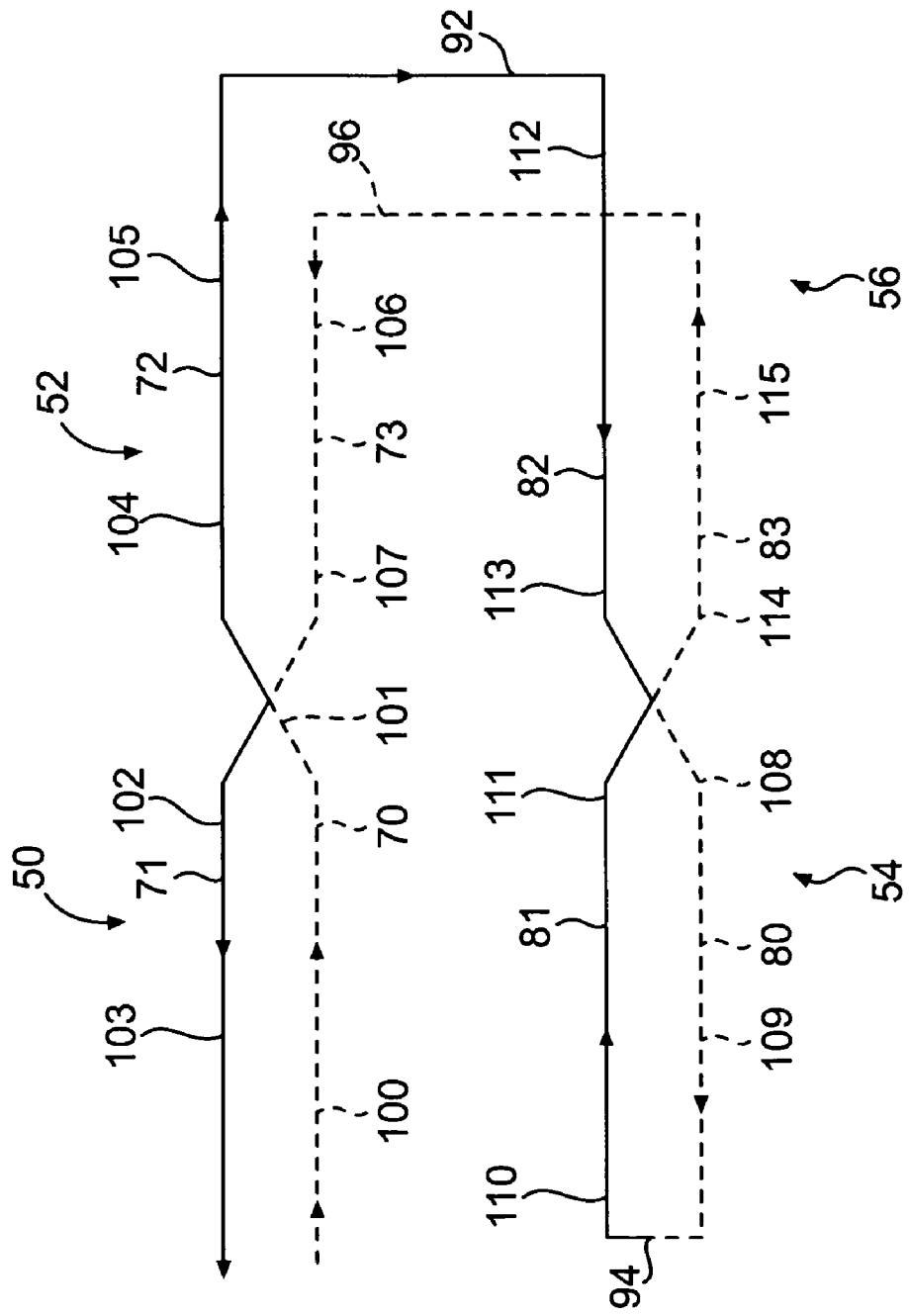
FIG. 2 is a circuit diagram of the current carrying write trace segments of FIG. 1.

In FIG. 2, lower write trace segment 70 of write trace segment pair 50 has a first end 100 and a second end 101. The upper write trace segment 71 of write trace segment pair 50 has a first end 102 and a second end 103. In FIG. 2, the upper write trace segment 72 of write trace segment pair 52 has a first end 104 and a second end 105. The lower write trace segment 73 of write trace segment pair 52 has a first end 106 and a second end 107. The lower write trace segment 80 of write trace segment pair 54 has a first end 108 and a second end 109. The upper write trace segment 81 of write trace segment pair 54 has a first end 110 and a second end 111. The upper write trace segment 82 of write trace segment pair 56 has a first end 112 and a second end 113. The lower write trace segment 83 of write trace segment pair 56 has a first end 114 and a second end 115.

End 105 of upper write trace segment 72 is electrically connected to end 112 of upper write trace segment 82 by line 92. End 109 of lower write trace segment 80 is electrically connected to end 110 of upper write trace segment 81 by line 94. End 115 of lower write trace segment 83 is electrically connected to end 106 of lower write trace segment 73 by line 96.

In FIGS. 1, 3, 5 and 6, ends 120 and 122, respectively, of legs 30 and 32 of the bridge circuit 10 are electrically connected together by line 124. Ends 126 and 128, respectively, of legs 30 and 32 of bridge circuit 10 are electrically connected together by line 129. Line 129 is grounded. Line 124 is connected to a power supply 130 by means of a line 132.

Figure 5:
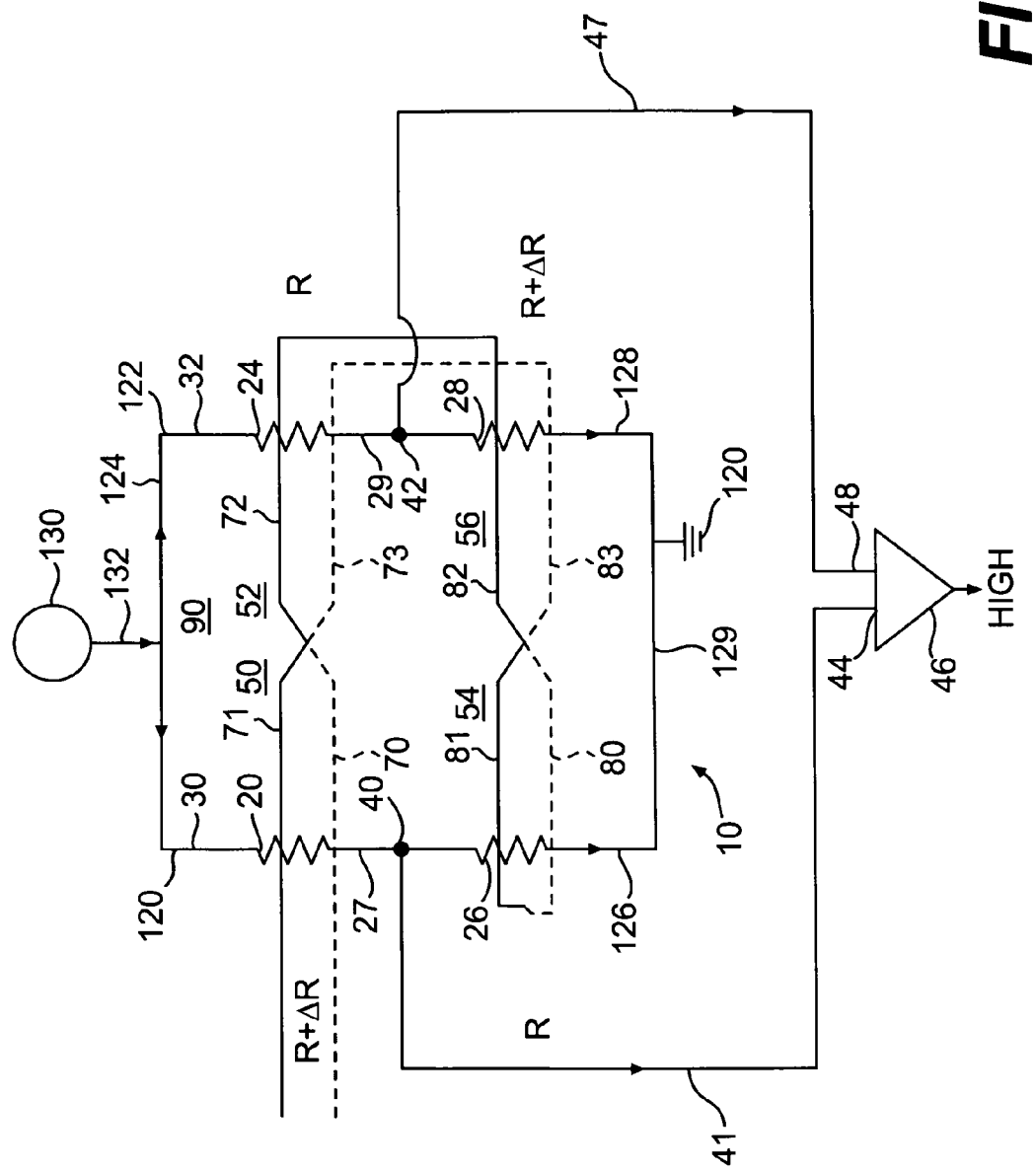
FIG. 5 is a circuit diagram of a magnetoresistive resistive memory cell of FIG. 1 plus a differential amplifier circuit connected to the magnetoresistive resistor memory cell.

In FIG. 1, a one bit is written into magnetoresistive bridge circuit 10 by sending a current into lower write trace segment 70 and then successively through connected write trace segments 72, 82, 80, 81, 83, 73, and 71. The one bit is being written into memory cell 90 in FIG. 1, and has been written into memory cell 90 of FIG. 5, by making the resistance of resistor 20 greater than the resistance of resistor 24, and by making the resistance of resistor 26 less than the resistance of resistor 28, as shown in FIGS. 1 and 5. The resistance of resistor 20 is made to be R+DeltaR. The resistance of resistor 24 is made to be R. The resistance of resistor 26 is made to be R. The resistance of resistor 28 is made to be R+DeltaR.

In FIG. 1, two magnetic layers of resistor 20 have opposite polarizations. A first layer of resistor 20 is pinned to have a polarization inward of the plane of FIG. 1. A second layer of resistor 20 is polarized outward of the plane of FIG. 1, by a magnetic field P3 produced by current passing through lower write trace segment 70 and through upper write trace segment 71, by the right hand rule.

In FIG. 1, two magnetic layers of resistor 24 have parallel polarizations. A first layer of resistor 24 is pinned to have a polarization inward in FIG. 1. A second layer of resistor 20 is polarized inward by a magnetic field P1 produced by current passing through upper write trace segment 72 and through lower write trace segment 73, by the right hand rule.

In FIG. 1, two magnetic layers of resistor 28 have opposite polarizations. A first layer of resistor 28 is pinned to have a polarization inward in FIG. 1. A second layer of resistor 28 is polarized outward by a magnetic field P2 produced by current passing through upper write trace segment 82 and through lower write trace segment 83, by the right hand rule.

In FIG. 1, two magnetic layers of resistor 26 have parallel polarizations. A first layer of resistor 26 is pinned to have a polarization inward in FIG. 1. A second layer of resistor 26 is polarized inward by a magnetic field P4 produced by current passing through lower write trace segment 80 and through upper write trace segment 81, by the right hand rule.

Figure 3:
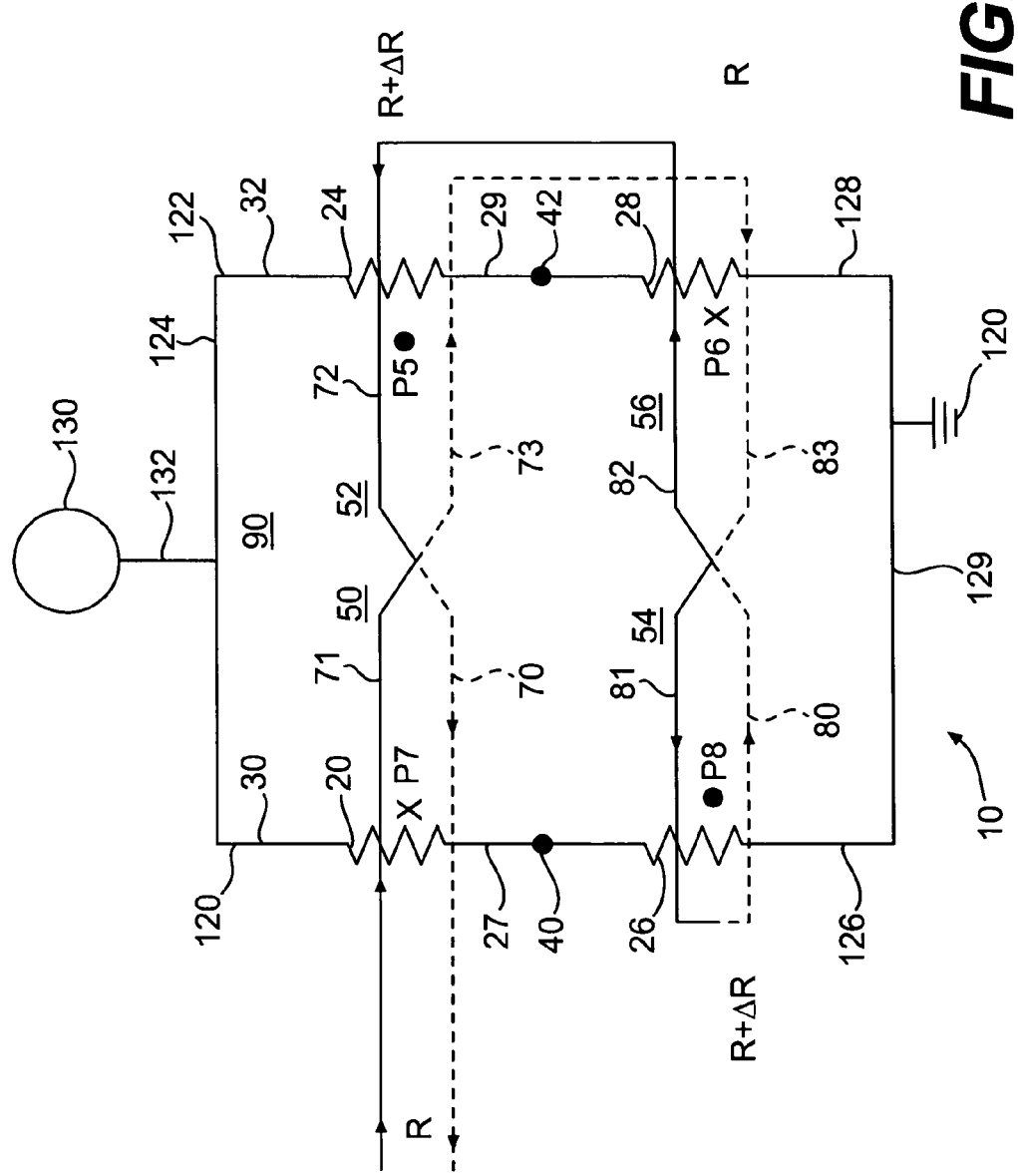
FIG. 3 is a circuit diagram of a magnetoresistive resistor memory cell, the magnetoresistive resistor memory cell having a magnetoresistive bridge circuit and current carrying write trace segments, a zero bit being written into the magneto resistive memory circuit.
Figure 4:
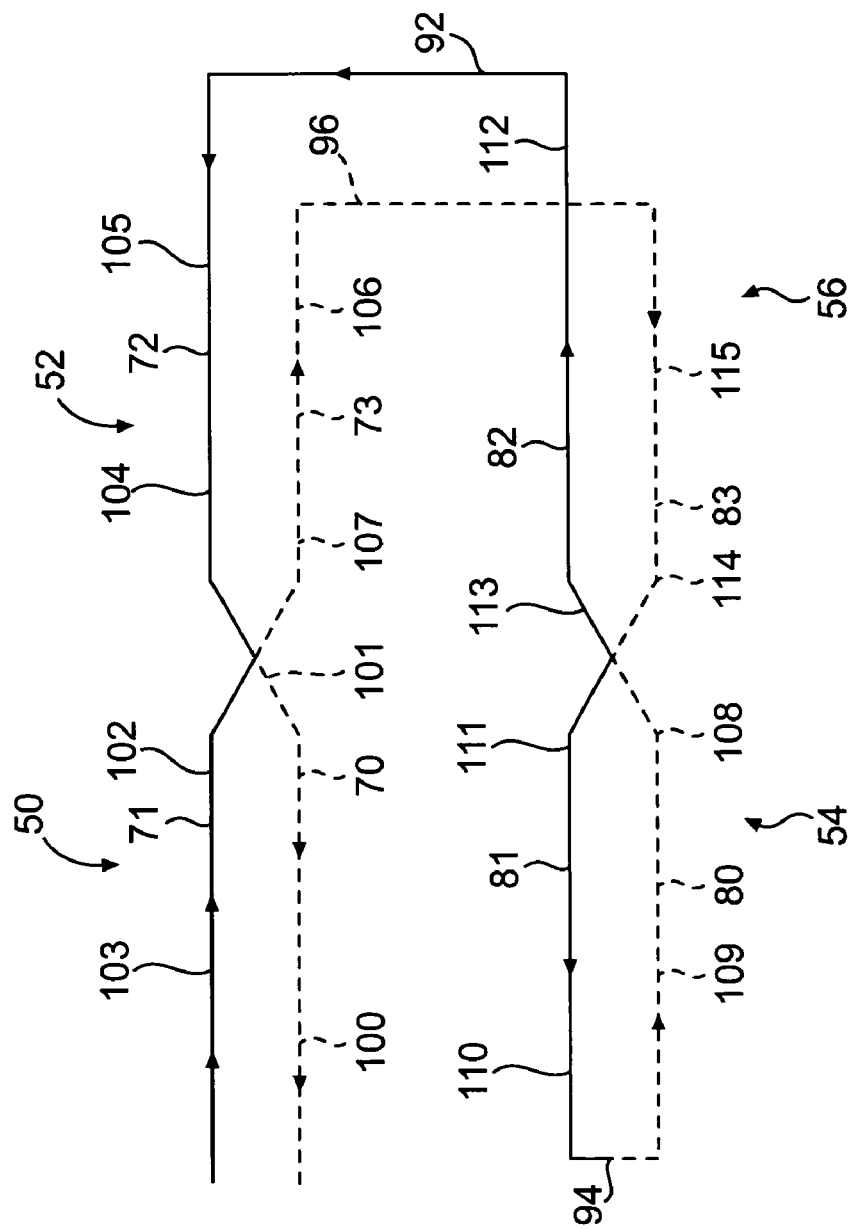
FIG. 4 is a circuit diagram of the current carrying write trace segments of FIG. 3.
Figure 6:
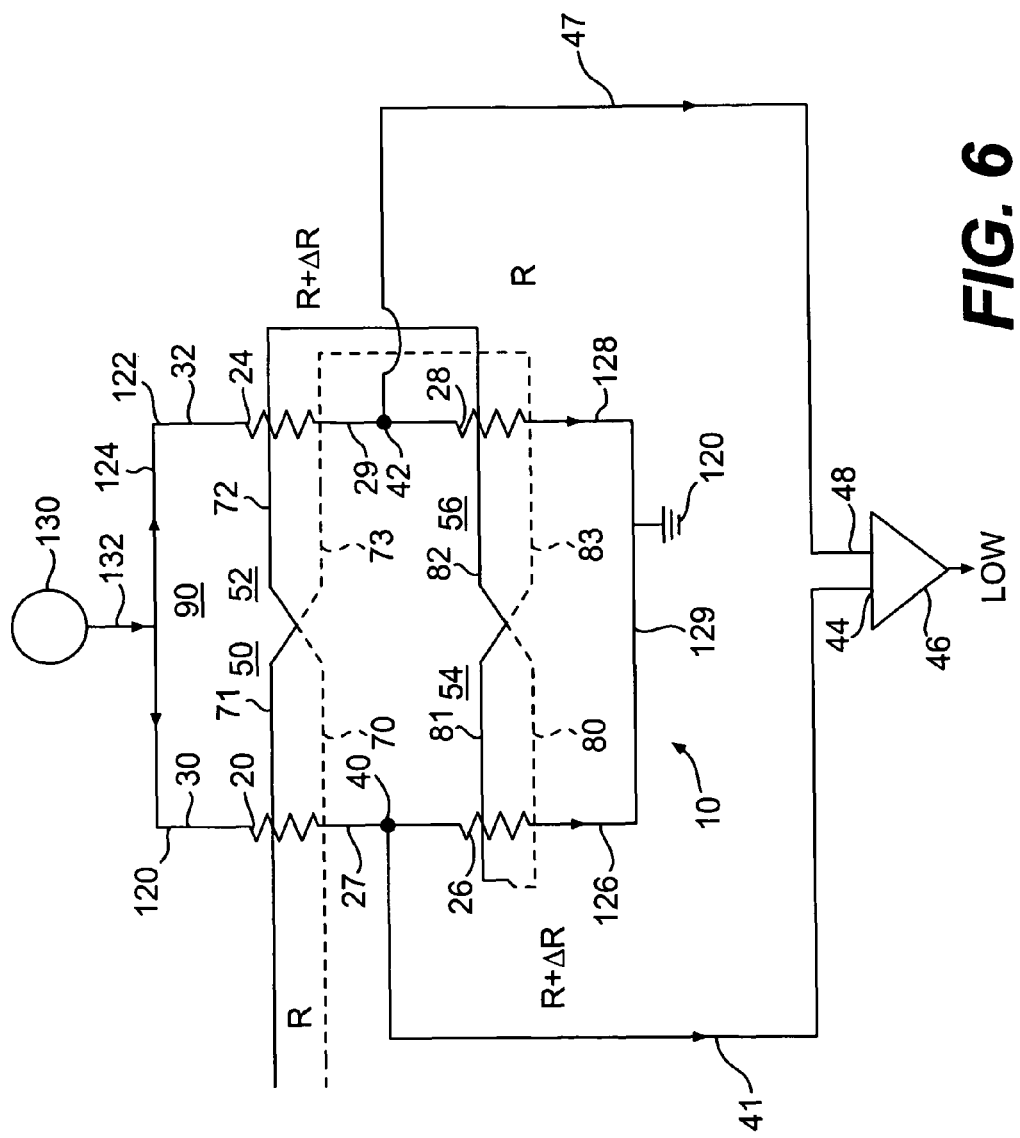
FIG. 6 is a circuit diagram of a magnetoresistive resistive memory cell of FIG. 3 plus a differential amplifier circuit connected to the magnetoresistive resistor memory cell.

In FIG. 3, a zero bit is written into magnetoresistive bridge circuit 10 by sending a current into upper write trace segment 71 and then through electrically connected write trace segments 73, 83, 81, 80, 82, 72 and 70. The zero bit is being written into memory cell 90 in FIG. 3, and has been written into memory cell 90 of FIG. 6, by making the resistance of resistor 24 greater than the resistance of resistor 20, and by making the resistance of resistor 26 greater than the resistance of resistor 28, as shown in FIGS. 3 and 6. The resistance of resistor 20 is made to be R. The resistance of resistor 24 is made to be R+DeltaR. The resistance of resistor 26 is made to be R+DeltaR. The resistance of resistor 28 is made to be R.

In FIG. 3, two magnetic layers of resistor 20 have parallel polarizations. A first layer of resistor 20 is pinned to have a polarization inward in FIG. 3. A second layer of resistor 20 is polarized inward by a magnetic field P7 produced by current passing through upper write trace segment 71 and through lower write trace segment 70.

In FIG. 3, two magnetic layers of resistor 24 have opposite polarizations. A first layer of resistor 20 is pinned to have a polarization inward in FIG. 3. A second layer of resistor 20 is polarized outward by a magnetic field P5 produced by current passing through lower write trace segment 73 and through upper write trace segment 72.

In FIG. 3, two magnetic layers of resistor 28 have parallel polarizations. A first layer of resistor 28 is pinned to have a polarization inward in FIG. 3. A second layer of resistor 28 is polarized inward by a magnetic field P6 produced by current passing through lower write trace segment 83 and through upper write trace segment 82.

In FIG. 3, two magnetic layers of resistor 26 have opposite polarizations. A first layer of resistor 26 is pinned to have a polarization inward in FIG. 3. A second layer of resistor 20 is polarized outward by a magnetic field P8 produced by current passing through upper write trace segment 81 and through lower write trace segment 80.

As shown in FIG. 5, line 41 electrically connects tap 40 of the magnetoresistive resistor bridge circuit 10 of FIG. 1 to a first input 44 of differential amplifier 46. A line 47 electrically connects tap 42 to a second input 48 of differential amplifier 46. As shown in FIG. 6, line 41 electrically connects tap 40 of the magnetoresistive resistor bridge circuit 10 of FIG. 3 to a first input 44 of differential amplifier 46. A line 47 electrically connects tap 42 to a second input 48 of differential amplifier 46.

The fact that the one bit has been written into the bridge circuit 10 of FIGS. 1 and 5, is determined by sending a current from power supply 130 through line 132, then through legs 30 and 32 to grounded line 120. The voltage on tap 42 is greater than the voltage on tap 40. This voltage difference is an indication that a one bit had been stored in bridge circuit 10.

Tap 42 is electrically connected into input 48 of differential amplifier 46 and tap 40 is electrically connected into input 44 of differential amplifier 46. A one output or high level output voltage of differential amplifier 46 occurs, as shown in FIG. 5, since the voltage on input 48 is greater than the voltage on input 44 of differential amplifier 46. A high level output voltage indicates that a one bit is stored in memory cell 90 of FIG. 5.

In FIG. 6, a zero bit is read from bridge circuit 10 of FIG. 6 by sending a current out from power supply 130, through line 132, to ground 120. The voltage on input 48 of differential amplifier 46 is detected to be lower than the voltage on input 44 of differential amplifier 46. This low level voltage is translated as a zero bit output from differential amplifier 46 and that a zero bit is stored in memory cell 90 of FIG. 6.

While the present invention has been disclosed in connection with the preferred embodiment thereof, it should be understood that there are other embodiments which fall within the spirit and scope of the invention as defined by the following claims.

What is claimed is:

1. A magnetoresistive resistor memory cell, comprising:
   (a) first and second magnetoresistive resistors connected in series, the first and second magnetoresistive resistors forming a first leg;
   (b) third and fourth magnetoresistive resistors connected in series, the third and fourth magnetoresistive resistors forming a second leg;
   (c) a first line for connecting a first end of the first leg to a first end of a second leg;
   (d) a second line for connecting a second end of the first leg to a second end of the second leg;
   (e) a first write trace segment pair straddling the first magnetoresistive resistor;
   (f) a second write trace segment pair straddling the third magnetoresistive resistor, the second write trace segment pair electrically connected to the first write trace segment pair;
   (g) a third write trace segment pair straddling the second magnetoresistive resistor, the third write trace segment pair electrically connected to the second write trace segment pair; and
   (h) a fourth write trace segment pair straddling the fourth magnetoresistive resistor, the fourth write trace segment pair electrically connected to the third write trace segment pair.

2. A magnetoresistive resistor memory cell, comprising:
   (a) a first leg having first and second magnetoresistive resistors connected in series;
   (b) a second leg having third and fourth magneto resistive resistors connected in series;
   (c) a first line for connecting a first end of the first leg to a first end of a second leg;
   (d) a second line for connecting a second end of the first leg to a second end of the second leg;
   (e) a first write trace segment pair straddling the first magnetoresistive resistor;
   (f) a second write trace segment pair straddling the second magnetoresistive resistor, an upper write trace segment of second write trace segment pair electrically connected to lower write trace segment of first write trace segment pair and lower write trace segment of second write trace segment pair connected to upper write trace segment of first write trace segment pair;
   (g) a third write trace segment pair straddling the third magnetoresistive resistor, an upper write trace segment of third write trace segment pair electrically connected to upper write trace segment of second write trace segment pair and lower write trace segment of third write trace segment pair connected to lower write trace segment of second write trace segment pair; and
   (h) a fourth write trace segment pair straddling the fourth magnetoresistive resistor, an upper write trace segment of fourth write trace segment pair electrically connected to lower write trace segment of third write trace segment pair and lower write trace segment of fourth write trace segment pair connected to upper write trace segment of third write trace segment pair.

* * * * *